United States Patent
Moon

(10) Patent No.: US 6,560,117 B2
(45) Date of Patent: May 6, 2003

(54) PACKAGED MICROELECTRONIC DIE ASSEMBLIES AND METHODS OF MANUFACTURE

(75) Inventor: Ow Chee Moon, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/944,723

(22) Filed: Aug. 30, 2001

(65) Prior Publication Data

US 2002/0030975 A1 Mar. 14, 2002

Related U.S. Application Data

(63) Continuation-in-part of application No. 09/606,432, filed on Jun. 28, 2000.

(51) Int. Cl.⁷ .................................................. H05K 1/00
(52) U.S. Cl. ...................... 361/749; 361/764; 361/760; 361/808; 257/777; 257/778
(58) Field of Search ................................ 361/749, 764, 361/760, 808, 718, 735, 736; 257/723, 713, 778, 686, 777

(56) References Cited

U.S. PATENT DOCUMENTS

| | | |
|---|---|---|
| 5,128,831 A | 7/1992 | Fox, III et al. |
| 5,252,857 A * | 10/1993 | Kane et al. .................. 257/686 |
| 5,323,060 A | 6/1994 | Fogal et al. |
| 5,776,797 A * | 7/1998 | Nicewarner et al. ........ 438/107 |
| 5,793,101 A | 8/1998 | Kuhn |
| 5,946,553 A | 8/1999 | Wood et al. |
| 5,986,209 A | 11/1999 | Tandy |
| 5,990,566 A | 11/1999 | Farnworth et al. |
| 6,020,624 A | 2/2000 | Wood et al. |
| 6,020,629 A | 2/2000 | Farnworth et al. |
| 6,028,365 A | 2/2000 | Akram et al. |
| 6,051,878 A | 4/2000 | Akram et al. |
| 6,072,233 A | 6/2000 | Corisis et al. |
| 6,072,236 A | 6/2000 | Akram et al. |
| 6,100,594 A | 8/2000 | Fukui et al. |
| 6,121,676 A * | 9/2000 | Solberg ...................... 257/686 |

OTHER PUBLICATIONS

U.S. patent application Ser. No. 09/634,056, Jiang et al., filed Aug. 09, 2000.
U.S. patent application Ser. No. 09/606,432, Moon et al., filed Jun. 28, 2000.
U.S. patent application Ser. No. 09/644,766, Corisis, filed Aug. 23, 2000.
"3–D IC Packaging." *3–D IC Packaging Industry News.* Semiconductor International May 1998 http://www.semi-conductor.net/semiconductor/archive/May98/docs/ind__ news2.html (Dec. 30, 1999).
Plößl, A. and Kräuter, G., "Wafer direct bonding: tailoring adhesion between brittle materials," *Materials Science and Engineering* R25(1–2): pp. 1–88, 1999.

*Primary Examiner*—David Martin
*Assistant Examiner*—Hung Bui
(74) *Attorney, Agent, or Firm*—Perkins Coie LLP

(57) ABSTRACT

Packaged microelectronic devices, interface substrates for packaging microelectronic devices, and methods of packaging single-die or stacked-die devices. One embodiment can include a die, an interface member having a die section attached to the die and an array section, and a casing encapsulating at least a portion of the die. The die section has a plurality of contacts coupled to bond-pads on the die, and the array section has an array of ball-pads coupled to the contacts by interconnecting circuitry in the interface member. The array section is folded over and/or under the die section, and the array section is attached to a backside of the die and/or a surface of the casing.

4 Claims, 13 Drawing Sheets

U.S. PATENT DOCUMENTS

| | | |
|---|---|---|
| 6,154,366 A | 11/2000 | Ma et al. |
| 6,160,718 A | 12/2000 | Vakilian |
| 6,175,149 B1 | 1/2001 | Akram |
| 6,212,767 B1 | 4/2001 | Tandy |
| 6,222,265 B1 | 4/2001 | Akram et al. |
| 6,235,554 B1 | 5/2001 | Akram et al. |
| 6,258,623 B1 | 7/2001 | Moden et al. |
| 6,262,895 B1 * | 7/2001 | Forthun .................... 257/707 |
| 6,281,577 B1 * | 8/2001 | Oppermann et al. ........ 257/690 |
| 6,294,839 B1 | 9/2001 | Mess et al. |
| 6,297,547 B1 | 10/2001 | Akram |
| 6,303,981 B1 | 10/2001 | Moden |

* cited by examiner

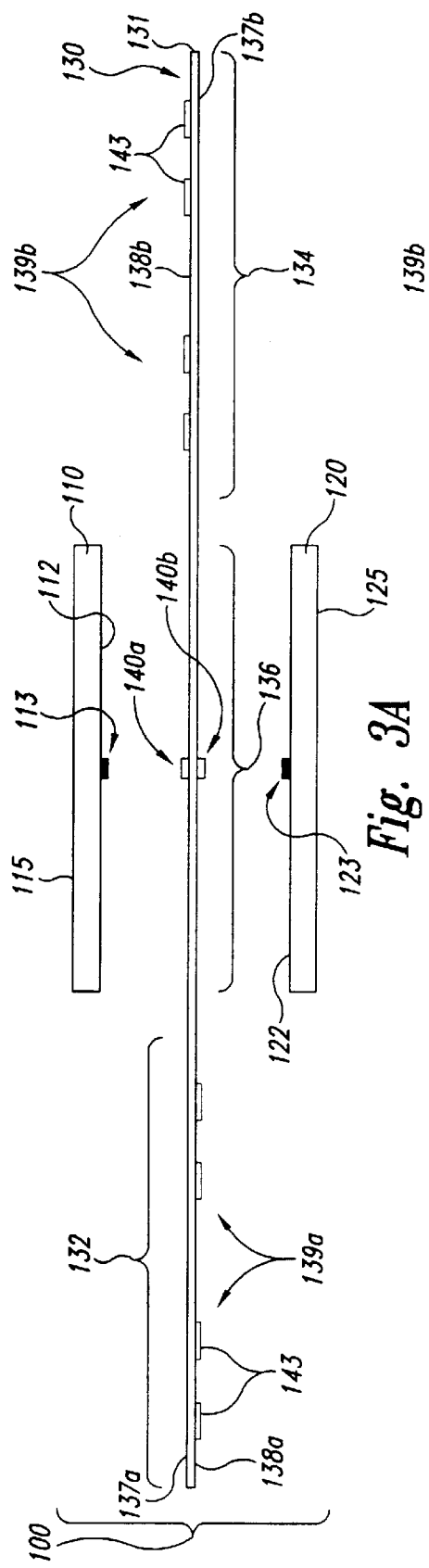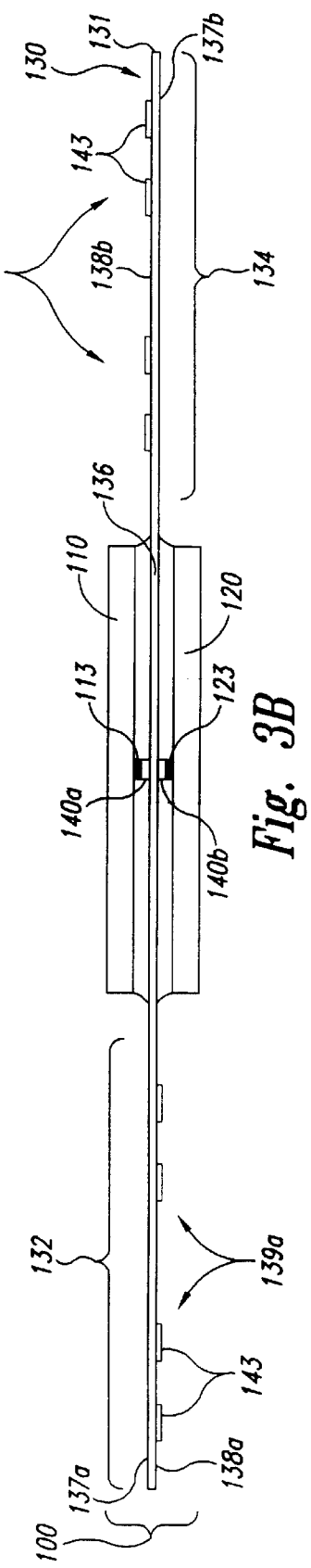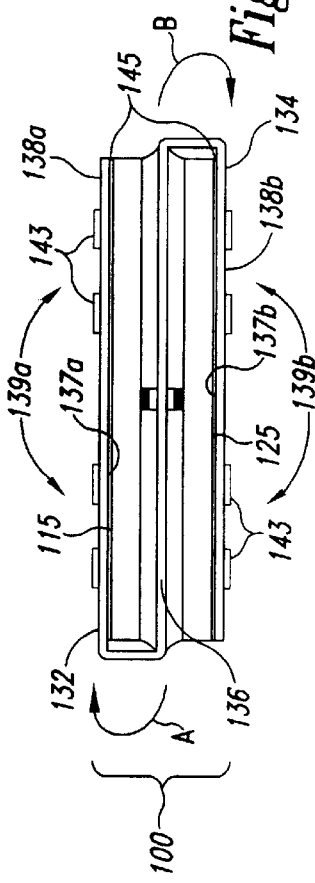

PACKAGED MICROELECTRONIC DIE ASSEMBLIES AND METHODS OF MANUFACTURE

CROSS-REFERENCED WITHIN APPLICATION

This application is a continuation-in-part of U.S. application Ser. No. 09/606,432, entitled Stacked Die Assemblies With A Plurality Of Microelectronic Devices And Methods Of Manufacture, and filed on Jun. 28, 2000, which is herein incorporated by reference.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by dicing the wafer and backgrinding the individual dies. After the dies have been singulated, they are typically "packaged" to couple the bond-pads to a larger array of electrical terminals that can be more easily coupled to the various power supply lines, signal lines and ground lines.

The individual dies can be packaged by electrically coupling the bond-pads on the die to arrays of pins, ball-pads, or other types of electrical terminals, and then encapsulating the die to protect it from environmental factors (e.g., moisture, particulates, static electricity and physical impact). In one application, the bond-pads are coupled to leads of a lead frame, and then the die and a portion of the lead frame is encapsulated in a protective plastic or other material. In other applications for packing high density components in smaller spaces, the bond-pads are electrically connected to contacts on a thin substrate that has an array of ball-pads. For example, one such application known as "flip-chip" packaging involves placing the active side of the die having the bond-pads downward against the contacts on a ball-grid array substrate, reflowing solder between the contacts and the bond-pads, and then molding an encapsulant around the die without covering the ball-pads on the ball-grid array. Other types of packing that use ball-grid arrays include "chip-on-board," "board-on-chip," and "flex-on-chip" devices. These types of devices are generally known as Ball-Grid-Array (BGA) packages.

Many electrical products require packaged microelectronic devices to have an extremely high density of components in a very limited amount of space. The space available for memory devices, processors, displays and other microelectronic components is quite limited in cell phones, PDAs, portable computers and many other products. As such, there is a strong drive to reduce the surface area or "footprint" that the device needs on a printed circuit board and the height of packaged microelectronic devices. This is becoming difficult because high performance devices generally have more bond-pads, which result in larger ball-grid arrays and thus larger footprints. Thus, there is a strong need to reduce the size of BGA packaged devices.

One concern of packaging BGA devices is that a significant amount of space is required between the die and the ball-pads on the support for clamping a mold to the support. Additionally, the ball-pads must be spaced apart from the die so that the molding compound or glob-top material does not foul the ball-pads. The distance between the die and the ball-pad array for accommodating the mold increases the footprint of the packaged device, which accordingly occupies more real estate on a printed circuit board. As a result, it may not be possible or practical to have a full array of ball-pads on a substrate because the footprint of such a substrate may be too large for use in certain types of devices (cellular phones, PDAs, and other compact products). Therefore, even though flip-chip, board-on-chip, chip-on-board, flex-on-chip and other types of BGA packaging have significant advantages over conventional lead frame packaging, even BGA packages may not be sufficiently small for the demanding requirements of many popular products.

One technique used to increase the density of microelectronic devices within a footprint on a printed circuit board is to stack one microelectronic die on top of another. It will be appreciated that stacking the dies increases the density of microelectronic devices within a given surface area on the printed circuit board. The microelectronic dies are typically connected to each other with an adhesive wire that is heat cured to form a secure bond between the dies. Stacking the dies, however, presents many challenges that are not applicable to single-die packages. For example, the upper die is typically smaller than the lower die, which limits the types of dies that can be stacked together and generally requires different dies in a single stack. For example, when two different dies are stacked on each other (e.g., a flash-memory device stacked on an SRAM device), the stacked-die assembly requires multiple test sockets, different testing devices, and multiple test programs to test the individual types of dies. This requires manufacturers to have different test sockets and test programs for each of the different types of dies, which is expensive because of the significant capital expenditure for the test equipment and the high labor costs for the skilled labor to perform the individual tests.

Another drawback of many techniques for stacking dies in which the dies are wire-bonded to the substrate is that the routing for the wire-bonds from the dies to the circuit board is complex. Typical stacked-die assemblies connect the terminals on the dies to the printed circuit board or another type of interposer substrate using wire-bonded connections. It is complex to form the wire-bond connections on a conventional stacked assembly because the contacts from both of the dies must be routed to correct locations on the interposer substrate. The available space on the interposer substrates, however, is generally a very small area that cannot accommodate the wire-bonding of both dies. It will be appreciated that wire-bonding stacked dies to a single interposer substrate is also expensive and may not produce robust connections.

Still another drawback of conventional stacked-die assemblies is that it is difficult to stack one two-die assembly to another single or multiple-die assembly. In conventional stacked-die assemblies, each die has a separate assembly of ball-pads for coupling each die to an interposer substrate. As such, conventional stacked-die assemblies do not allow more than two dies to be stacked together in a single assembly. It is accordingly difficult to increase the capacity (e.g., the memory capacity of like memory devices) or the functional performance (e.g., combining a flash-memory device and an SRAM device) beyond the two-die stacked-die assemblies that are currently the state of the art.

SUMMARY

The present invention is directed toward packaged microelectronic devices, interface substrates for packaging microelectronic devices, and methods of packaging single-die or stacked-die microelectronic devices. In an aspect of one embodiment related to stacked-die packages, a microelectronic device can include a first die, a second die juxtaposed to the first die, and an interface substrate coupled to the first and second dies. The first die can have a first integrated circuit and a first terminal array coupled to the first integrated circuit, and the second die can have a second integrated circuit and a second terminal array coupled to the second integrated circuit. The interface substrate can comprise a body, a first contact array on the body that is electrically coupled to the first terminal array of the first die, a second contact array on the body that is electrically coupled to the second terminal array of the second die, and at least one ball-pad array on the body. The interface substrate can also include interconnecting circuitry electrically coupling at least a portion of the first and second contact arrays with at least a portion of the first ball-pad array.

In an aspect of another embodiment that is related to single-die or stacked-die packages, a microelectronic device comprises a microelectronic die and an interface substrate or redistribution member. The die can include an interior surface, an integrated circuit, and a plurality of bond-pads arranged in a first terminal array at the interior surface. The bond-pads are coupled to the integrated circuit. The interface substrate can include a first section or die section attached to the interior surface of the die, an intermediate section extending at an angle from the first section, and a second section or array section extending from the intermediate section. The array section is spaced across from the die section. For example, the die section of the interface substrate can be attached to an active surface of the microelectronic die, and the array section of the interface substrate can be attached to either the backside of the die, a casing that covers the backside of the die, or a casing that covers the first terminal array on the die. As such, even though the array section is spaced across from the die section, the space between the array and die sections of the interface substrate can be occupied by the die and/or the casing. The interface substrate can further comprise a plurality of first contacts arranged in a first contact array on the die section, a plurality of ball-pads on the array section that are arranged in an exposed ball-pad array, and interconnecting circuitry. The first contacts are electrically coupled to the bond-pads on the die, and the interconnecting circuitry is electrically coupled to the ball-pads and the first contacts.

Another embodiment of the invention is directed toward a microelectronic device comprising a microelectronic die, a casing encapsulating at least a portion of the die, and a redistribution member coupled to the die and the casing. The die includes an active side, a plurality of bond-pads carried on the active side, an integrated circuit coupled to at least a number of the bond-pads, and an inactive side or backside. The casing can encapsulate only a portion of the die, such as the bond-pads on the active side, or it can encapsulate the entire die. The casing can have a side surface generally along the side of the die and an exterior face.

The redistribution member can include a die section between the active side of the die and at least a portion of the casing, an array section attached to the inactive side of the die and/or the exterior face of the casing, and an interconnecting section extending along at least a portion of the side surface of the casing between the die section and the array section. In one particular embodiment, the die section is aligned with the array section such that either the die and/or the casing is between the die section and the array section.

The redistribution member can further include a plurality of first contacts arranged in a contact array on the die section and electrically coupled to corresponding bond-pads on the die, and a plurality of ball-pads arranged in an exposed ball-pad array on the array section and electrically coupled to the first contacts via the interconnecting section.

BRIEF DESCRIPTION OF THE DRAWINGS

FIGS. 3A–3C are side elevation views illustrating a method for assembling a stacked-die assembly in accordance with an embodiment of the invention.

DETAILED DESCRIPTION

The following description is directed toward packaged microelectronic devices having one or more microelectronic dies, interface substrates for facilitating the packaging of microelectronic dies, and methods for packaging microelectronic dies. The terms "substrate interface," "coupling member" and "distribution member" are used herein to mean any type of device for coupling a microelectronic die to a printed circuit board, another microelectronic die, or another type of device. Many specific details of several embodiments are described below with reference to memory devices and semiconductor wafers to provide a thorough understanding of such embodiments. The present invention, however, can be practiced using other types of microelectronic devices or micro-mechanical devices. A person skilled in the art will thus understand that the invention may have additional embodiments, or that the invention may be practiced without several of the details described in this section.

Figure 1:
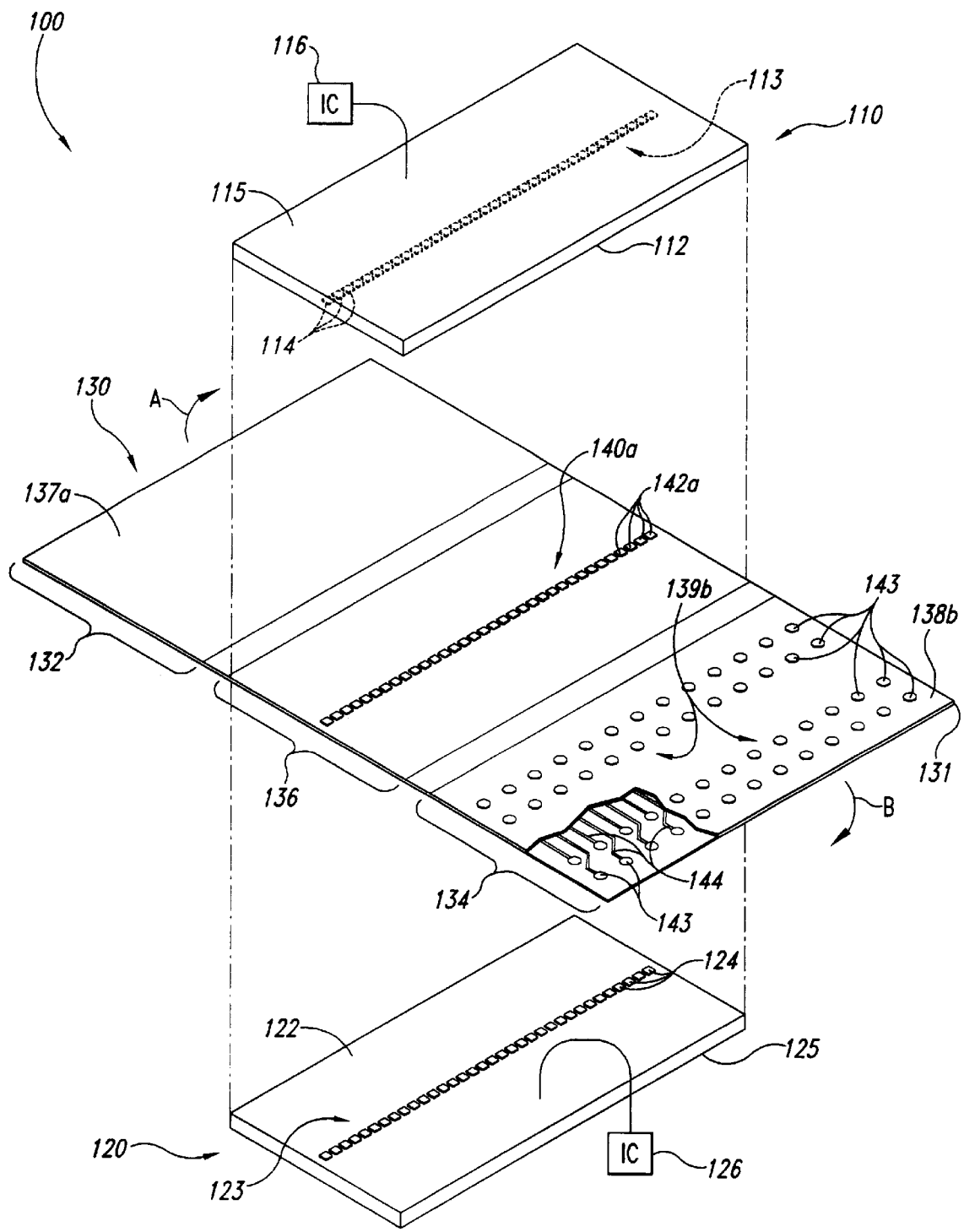
FIG. 1 is an exploded isometric view of a stacked-die assembly having a plurality of microelectronic devices in accordance with one embodiment of the invention.

FIG. 1 is an exploded isometric view of a stacked-die assembly 100 in accordance with one embodiment of the invention including a first die 110, a second die 120, and an interface substrate or coupling member 130 attached to the first and second dies 110 and 120. The first die 110 generally has an interior surface 112, a first terminal array 113 including a plurality of first bond-pads or terminals 114 extending along the interior surface 112, an exterior surface 115, and at least one integrated circuit 116 (shown schematically). The second die 120 can have an inner surface 122, a second terminal array 123 having a plurality of second bond-pads or terminals 124 extending along the inner surface 122, an outer surface 125, and at least one second integrated circuit 126 (shown schematically). The terminal arrays 113 and 123 can be center arrays (as shown), periphery arrays, or other configurations for connecting the integrated circuits 116 and 126 to other components. The terminal arrays 113 and 123 are typically gold bumps or solder bumps that have a very fine pitch of 0.075 mm, but the terminal arrays 113 and 123 can be made from other materials and have other pitches. The first and second dies 110 and 120 can be SRAM, DRAM, flash-memory, processors and other types of microelectronic devices. The first and second dies 110 and 120 can be the same type of devices (e.g., SRAM devices), or they can be multiple-function assemblies with multiple types of devices (e.g., a flash-memory device and an SRAM device).

Figure 2:
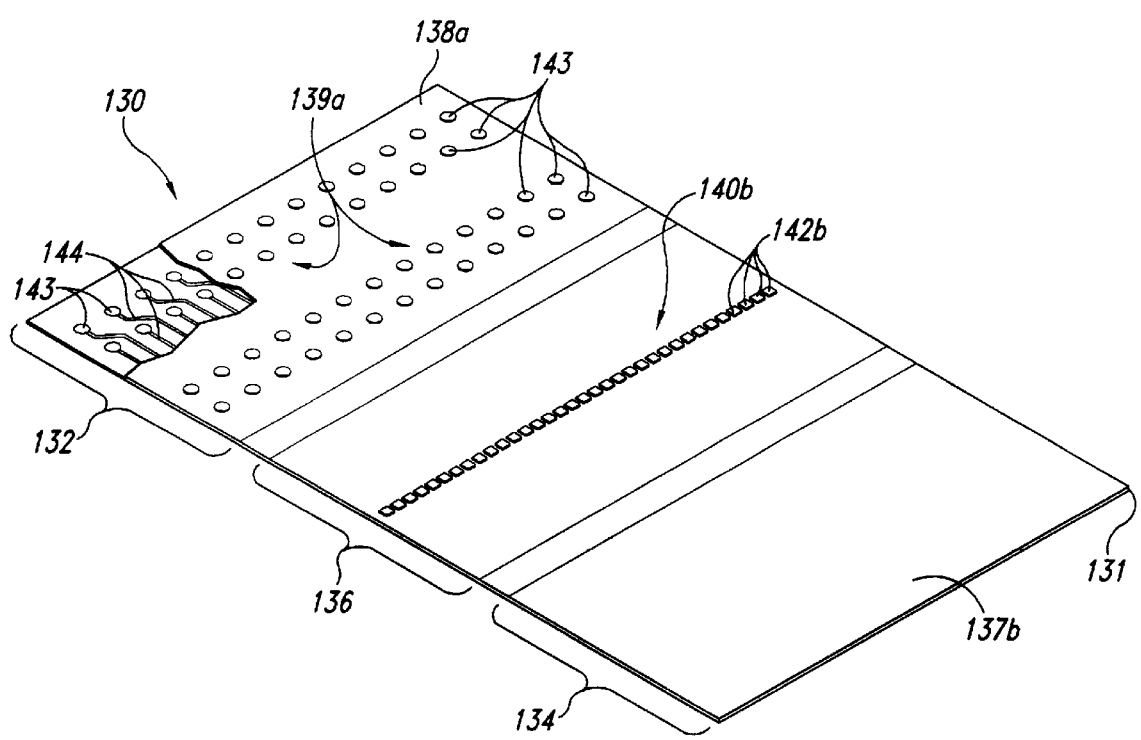
FIG. 2 is a bottom isometric view of an embodiment of an interface substrate for use with the stacked-die assembly of FIG. 1.

The interface substrate 130, redistribution member, or coupling member can be a thin, flexible substrate or tape that bonds or adheres to the first and second dies 110 and 120. FIG. 1 is a top isometric view of an embodiment of the interface substrate 130, and FIG. 2 is a bottom isometric view of the same interface substrate 130. Referring to FIGS. 1 and 2 together, the interface substrate 130 can include a body 131 having a first section 132, a second section 134, and an intermediate section 136. In the embodiment shown in FIGS. 1 and 2, the first section 132 is on one end of the intermediate section 136, and the second section 134 is on the other end of the intermediate section 136. Suitable ribbons or tapes from which the interface substrate 130 can be made are manufactured by 3M Corporation of Minnesota.

The intermediate section 136 of the embodiment shown in FIGS. 1 and 2 has a first contact array 140a with a plurality of first contacts 142a (FIG. 1) and a second contact array 140b with a plurality of second contacts 142b (FIG. 2). The first contacts 142a in the first contact array 140a are configured to contact respective terminals 114 of the first terminal array 113 on the first die 110. Similarly, the second contacts 142b of the second contact array 140b are configured to contact respective terminals 124 of the second terminal array 123 on the second die 120. In this embodiment, the first die 110 is mounted on one side of the intermediate section 136 and the second die 120 is mounted on the other side of the intermediate section 136. As explained in more detail below, the interface member 130 can have only the intermediate section 136 (i.e., a die section) and one of the first or second sections (i.e., a ball array section) for use in single-die and/or stacked-die configurations.

The embodiments of the first and second sections 132 and 134 shown in FIGS. 1 and 2 provide separate ball-pad arrays for distributing the fine-pitch, high-density terminals 114 and 124 to a larger pitch that can be attached to a printed circuit board or another microelectronic device. The first section 132 can include a first contact surface 137a (FIG. 1) for engaging the exterior surface 115 of the first die 110, and the second section 134 can include a second contact surface 137b (FIG. 2) for contacting the outer surface 125 of the second die 120. The first section 132 can also include a first access surface 138a (FIG. 2) with a first ball-pad array 139a, and the second section 134 can include a second access surface 138b (FIG. 1) with a second ball-pad array 139b.

The first and second ball-pad arrays 139a and 139b can have a plurality of ball-pads 143 that are connected to the first contacts 142a of the first contact array 140a and/or the second contacts 142b of the second contact array 140b by interconnecting circuitry 144. The first and second ball-pad arrays 139a and 139b can be identical or they can have different configurations. In one embodiment, for example, the first and second ball-pad arrays 139a and 139b are identical arrays in which all of the contacts 142a and 142b on the intermediate section 136 are connected to the same respective ball-pads 143 on both the first and second ball-pad arrays 139a and 139b. The ball-pad arrays 139a and 139b can further include additional ball-pads for electrically coupling one stacked-die assembly onto another to form a multiple stacked-die assembly. In another embodiment, the first contacts 142a can be coupled to only one of the first or second ball-pad arrays 139a or 139b, and the second contacts 142b can be coupled to only the other one of the first or second ball-pad arrays 139a or 139b. In still another embodiment, one portion of the first contacts 142a can be coupled to the first ball-pad array 139a and another portion of the first contacts 142a can be coupled to the second ball-pad array 139b. The ball-pad arrays 139a and 139b can accordingly have several different configurations.

FIGS. 3A–3C care side elevation views illustrating an embodiment of a process for manufacturing the stacked-die assembly 100 shown in FIGS. 1 and 2. The reference numbers in FIGS. 3A–3C correspond to the reference numbers in FIGS. 1 and 2, and thus like reference numbers refer to like components in FIGS. 1–3C. Referring to FIG. 3A, the first and second dies 110 and 120 are aligned with the intermediate section 136 of the interface substrate 130 such that the first terminal array 113 of the first die 110 is superimposed over the first contact array 140a, and the second terminal array 123 of the second die 120 is aligned with the second contact array 140b. Referring to FIG. 3B, the first and second dies 110 and 120 are adhered to the intermediate section 136 of the interface substrate 130. The first and second dies 110 and 120 can be adhered to the intermediate section 136 using a flowable underfill, anisotropic conductive films, anisotropic conductive pastes, thermal compression techniques, thermalsonic techniques, no-flow underfill techniques, or other techniques that are known to persons skilled in the art. Referring to FIG. 3C, the first section 132 of the interface substrate 130 is folded up (arrow A) to engage the first contact surface 137*a* with the exterior surface 115 of the first die 110. The second section 134 of the interface substrate 130 is folded down (arrow B) so that the second contact surface 137*b* engages the outer surface 125 of the second die 120. The first and second contact surfaces 137*a* and 137*b* of the interface substrate 130 are generally adhered to the first and second dies 110 and 120 by an adhesive 145. Once the first and second sections 132 and 134 of the interface substrate 130 are adhered to the first and second dies 110 and 120, the stacked-die assembly 100 is ready for testing and receiving solder balls on the ball-pads 143.

The embodiment of the stacked-die assembly 100 shown in FIGS. 1–3C is expected to reduce capital expenditures and operating costs for testing stacked-die assemblies. One feature of several embodiments of the stacked-die assembly 100 is that all of the terminals in the first and second terminal arrays 113 and 123 of the first and second dies 110 and 120 can be coupled to the ball-pads 143 of the first ball-pad array 139*a* and/or the second ball-pad array 139*b*. As a result, both of the first and second dies 110 and 120 can be tested in a single test handler using the same test sockets, the same burn-in board, the same test program, and the same test procedure. Additionally, if the first and second ball-pad arrays 139*a* and 139*b* are identical to each other, the dies 110 and 120 can be tested with the same test handler even when the first die 110 is a different type of die than the second die 120.

Several embodiments of the stacked-die assembly 100 shown in FIGS. 1–3C are also expected to simplify the packaging process for creating stacked-die assemblies. For example, when the first and second ball-pad arrays 139*a* and 139*b* are identical arrays in which all of the terminals in both the first terminal array 113 of the first die 110 and the second terminal array 123 of the second die 120 are coupled to corresponding ball-pads 143 in each array 139*a* and 139*b*, then the only process step that needs to be customized for a specific stacked-die assembly is the pattern of solder balls placed on the ball-pad arrays 139*a* and/or 139*b* at the end of the assembly/testing procedure. Therefore, the interface substrate 130 simplifies the process of fabricating stacked-die assemblies.

Several embodiments of the stacked-die assembly 100 are also expected to reduce the cost of manufacturing interface substrates. In conventional systems, an individual interface substrate must be designed and manufactured for each type of die in a stacked-die assembly. In the embodiments of the stacked-die assembly 100 shown in FIGS. 1–3C in which the first and second ball-pad assemblies 139*a* and 139*b* are identical, a single mask and tooling system is required for fabricating the interface substrate 130. Therefore, several embodiments of the stacked-die assembly 100 are expected to reduce the cost of assembling microelectronic devices.

Figure 4:
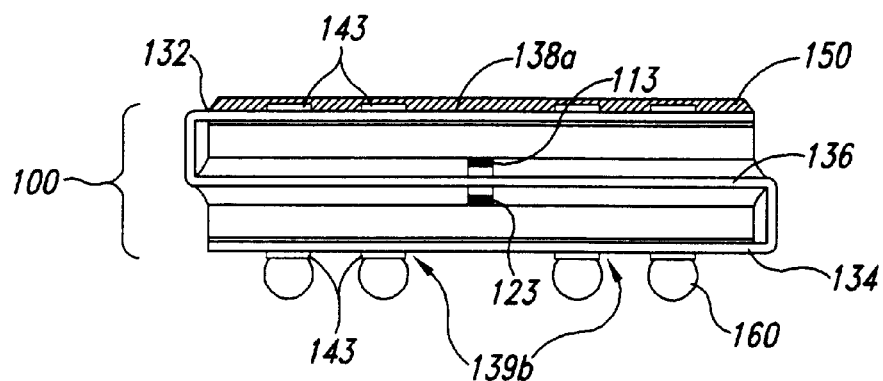
FIG. 4 is a side elevation view of one embodiment of a stacked-die assembly in accordance with an embodiment of the invention.

FIG. 4 is a side elevation view of another embodiment of the stacked-die assembly 100. In this embodiment, the ball-pads 143 on the first access surface 138*a* of the first section 132 are covered with an insulation layer 150. Additionally, a plurality of solder balls 160 are deposited onto individual ball-pads 143 of the second ball-pad array 139*b*. The solder balls 160 are generally distributed in a pattern to couple the terminals of the first and second terminal arrays 113 and 123 to appropriate points on a printed circuit board or another type of component.

Figure 5:
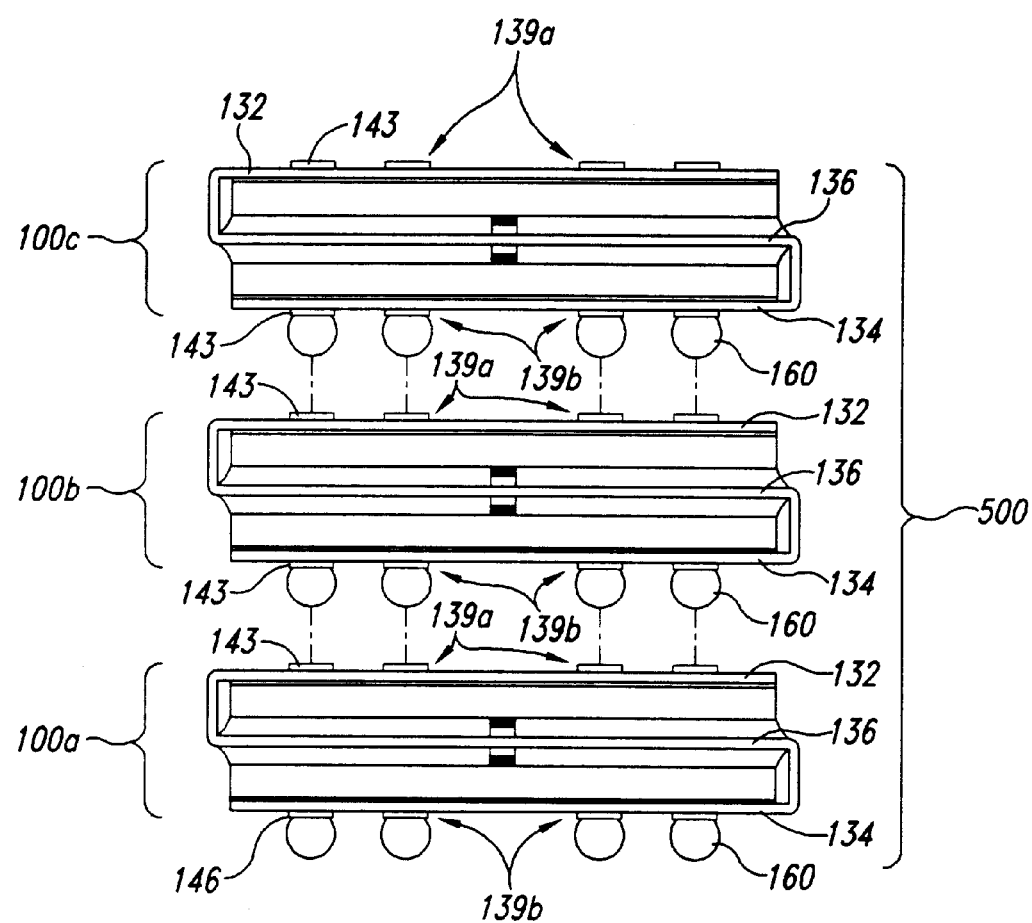
FIG. 5 is a side elevation view of a stacked-die assembly in accordance with another embodiment of the invention.

FIG 5 is a side elevation view of a multiple stacked-die assembly 500 in accordance with another embodiment of the invention. In this embodiment, the multiple stacked-die assembly 500 includes a plurality of individual stacked-die assemblies 100*a*–100*c*. Each of the individual stacked-die assemblies 100*a*–100*c* can be the same as the stacked-die assembly 100 described above with reference to FIGS. 1–3C. In this embodiment, a plurality of solder balls 160 are deposited onto the ball-pads 143 of the second ball-pad array 139*b* of each of the stacked-die assemblies 100*a*–100*c*. The second stacked-die assembly 100*b* is coupled to the first stacked-die assembly 100*a* by contacting the solder balls 160 on the second ball-pad array 139*b* of the second stacked-die assembly 100*b* with selected ball-pads 143 of the first ball-pad array 139*a* of the first stacked-die assembly 100*a*. The third stacked-die assembly 100*c* can be similarly coupled to the second stacked-die assembly 100*b*. The multiple stacked-die assembly 500 can have any number of individual stacked-die assemblies 100, and it is not necessarily limited to having three stacked-die assemblies. For example, the multiple stacked-die assembly 500 can have two or more individual stacked-die assemblies.

The multiple stacked-die assembly 500 illustrated in FIG. 5 provides a significant increase in the configurations of stacked microelectronic devices. In one embodiment, all of the individual dies can be the same type of microelectronic device to significantly increase the capacity of a component without occupying a greater surface area on the printed circuit board. The microelectronic devices, for example, can all be SRAM or DRAM devices to increase the memory capacity of a component. In other embodiments in which the individual microelectronic devices are different types of devices, then the multiple stacked-die assembly 500 significantly increases the number of functions of a component because many different types of devices can be mounted onto the same surface area of a printed circuit board.

The first stacked-die assembly 100*a* of the multiple stacked-die assembly 500 in FIG. 5 can be mounted to a printed circuit board to couple all of the stacked-die assemblies 100*a*–100*c* to the printed circuit board. In this example, the first ball-pad array 139*a* of the first stacked-die assembly 100*a* has ball-pads 143 that are configured to contact the solder balls 160 depending from the ball-pads 143 on the second ball-pad array 139*b* of the second stacked-die assembly 100*b*. The interface substrate 130 of the first stacked-die assembly 100*a* can accordingly have interconnecting circuitry 144 with a pass-through circuit to couple the ball-pads 143 on the first ball-pad array 139*a* of the first stacked-die assembly 100*a* that contact the solder balls 160 depending from the second ball-pad array 139*b* of the second stacked-die assembly 100*b* with the desired ball-pads 143 on the second ball-pad array 139*b* of the first stacked-die assembly 100*a*. Such a pass-through circuit allows the interface substrate 130 of the first stacked-die assembly 100*a* to be a conduit for the second stacked-die assembly 100*b*. The interface substrate 130 of each of the first and second stacked-die assemblies 100*a* and 100*b* can also be configured with pass-through circuits that coupled the third stacked-die assembly 100*c* to a printed circuit board via the first and second stacked-die assemblies 100*a* and 100*b*.

Figure 6:
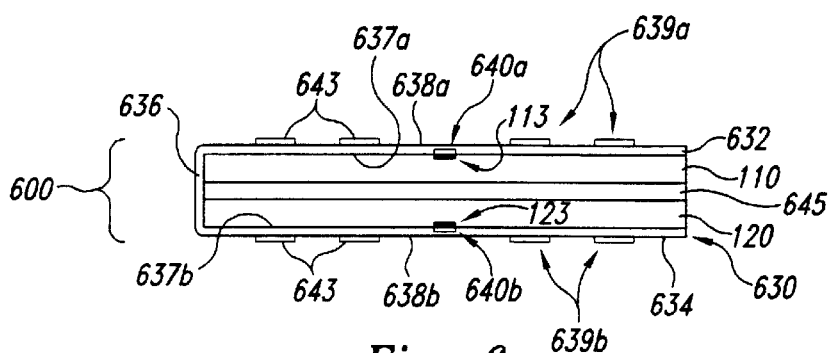
FIG. 6 is a side elevation view of a stacked-die assembly in accordance with yet another embodiment of the invention.

FIG. 6 is a elevation view of another stacked-die assembly 600 in accordance with another embodiment of the invention. In this embodiment, the stacked-die assembly 600 includes a first die 110, a second die 120, and an interface substrate 630 attached to the first and second dies 110 and 120. The first and second dies 110 and 120 can be similar to those described above with respect to FIGS. 1–3C, and thus like reference numbers refer to like parts in FIGS. 1–3C and 6. Unlike the stacked-die assembly 100 in FIGS. 1–3C, however, the interior surface of the first die 110 in the stacked-die assembly 600 is bonded to the inner surface of the second die 120 by an adhesive 645. The first terminal array 113 is accordingly on the exterior surface of the first die 110, and the second terminal array 123 is on the outer surface of the second die 120. As such, the first and second terminal arrays 113 and 123 face outwardly away from each other in the stacked-die assembly 600.

Figure 7:
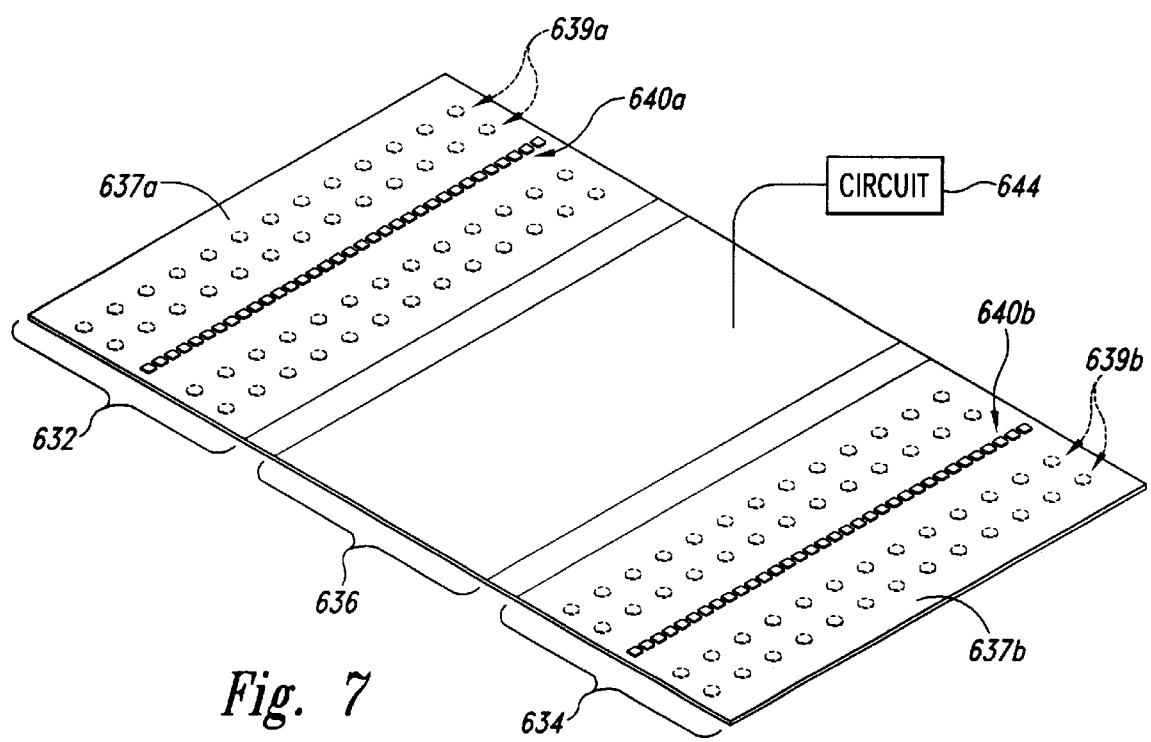
FIG. 7 is a top isometric view of an embodiment of an interface substrate for use with the stacked-die assembly of FIG. 6.

The interface substrate 630 has a body with a first section 632, a second section 634, and an intermediate section 636 between the first and second sections 632 and 634. FIG. 7 is a top isometric view of the interface substrate 630 of the stacked-die assembly 600 shown in FIG. 6. Referring to FIGS. 6 and 7 together, the first section 632 of the interface substrate 630 can have a first contact surface 637a, a first access surface 638a, a first ball-pad array 639a including a plurality of ball-pads 643 on the first access surface 638a, and a first contact array 640a on the first contact surface 637a. The second section 634 of the interface substrate 630 can similarly include a second contact surface 637b, a second access surface 638b, a second ball-pad array 639b including a plurality of ball-pads 643 on the second access surface 638b, and a second contact array 640b on the second contact surface 637b. The first contact array 640a engages the first terminal array 113 of the first die 110, and the second contact array 640b engages the second terminal array 123 of the second die 120. The first and second contact arrays 640a and 640b can be electrically coupled to the ball-pads 643 of the first ball-pad array 639a and/or the second ball-pad array 639a by interconnecting circuitry 644 (shown schematically) in or on the interface substrate 630. It will be appreciated that the first and second contact arrays 640a and 640b, and the first and second ball-pad arrays 639a and 639a, can have the same configurations as described above with respect to FIGS. 1–5.

Figure 8:
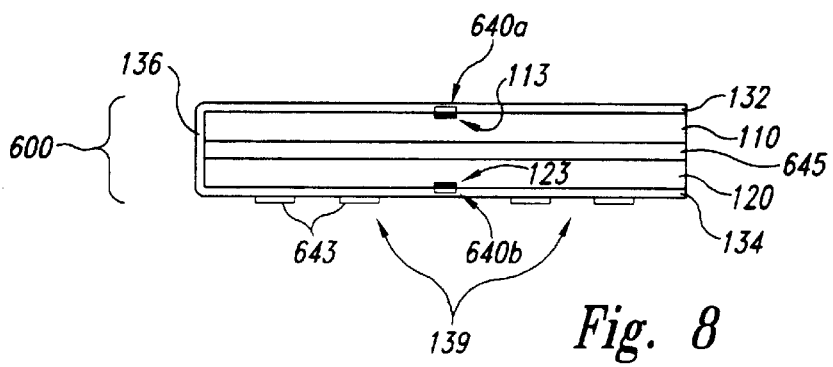
FIG. 8 is a side elevation view of a stacked-die assembly in accordance with another embodiment of the invention.

FIG. 8 is a side elevation view of another embodiment of the stacked-die assembly 600 in which the interface substrate 630 has only one ball-pad array 139 on the second section 134. It will be appreciated that the single ball-pad array 139 shown in this embodiment can alternatively be on the first section 132 depending upon the particular application for the stacked-die assembly 600. The interconnecting circuitry 644 accordingly couples both the first and second contact arrays 640a and 640b to the ball-pad array 139 on either the first or the second sections 132 or 134. This embodiment of the stacked-die assembly 600 is particularly well suited for being a sole stacked-die assembly or the top stacked-die assembly of a multiple stacked-die assembly because the section of the interface substrate that does not have a ball-pad array electrically insulates the assembly without requiring a separate insulation layer.

Figure 9:
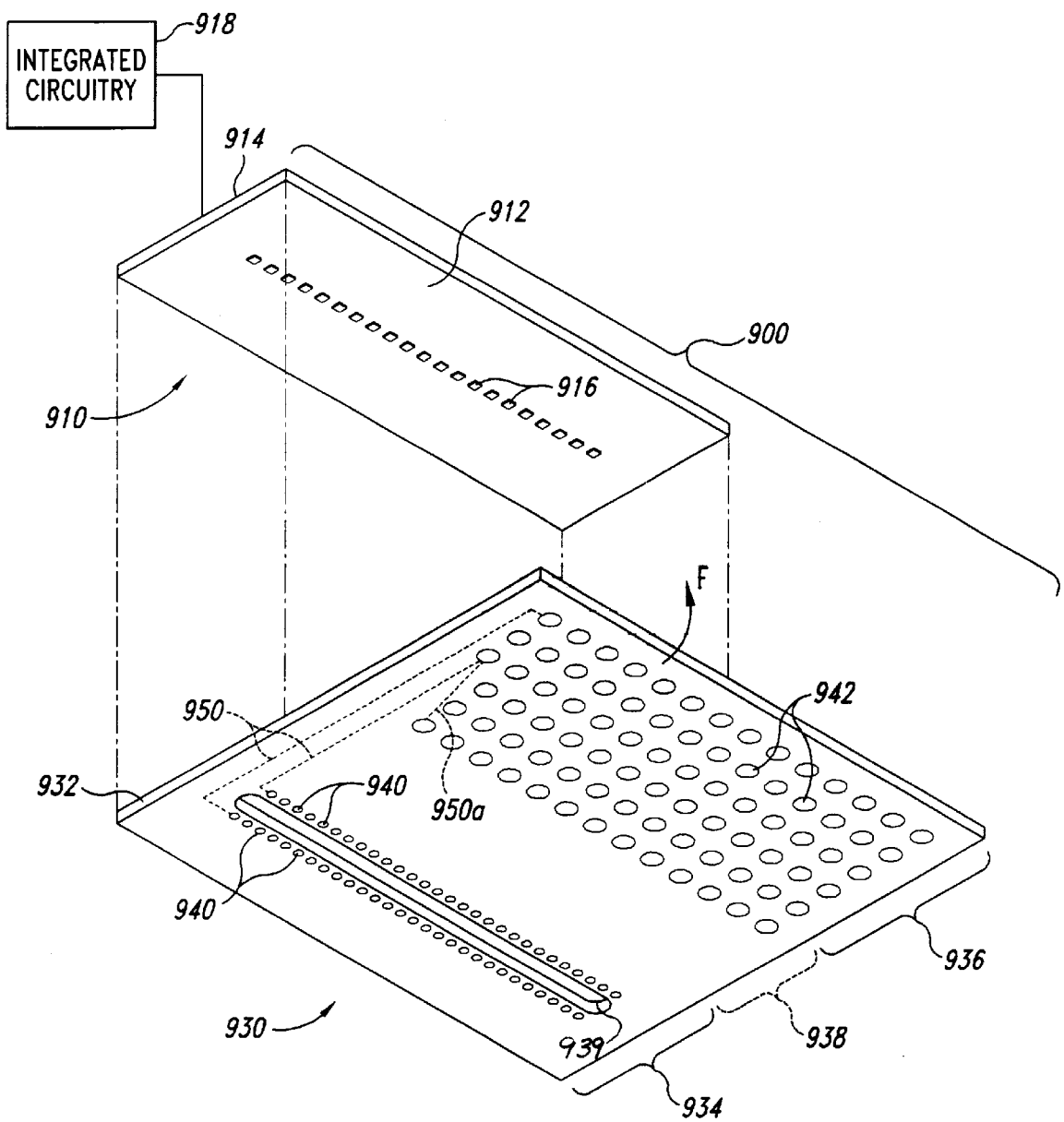
FIG. 9 is an exploded isometric view of a microelectronic device having a single die and an interface substrate in accordance with another embodiment of the invention.

FIG. 9 is an exploded isometric view showing a microelectronic device 900 including a microelectronic die 910 and an interface substrate or redistribution member 930 in accordance with another embodiment of the invention. The die 910 can have an active side 912, an inactive side 914 (i.e., backside), and a plurality of bond-pads 916 on the active side 912. The die 910 can also include integrated circuitry 918 that is coupled to at least a number of the bond-pads 916 to provide the desired electrical connections to the integrated circuitry 918. Many features of the die 910 and the redistribution member 930 are similar to the die 110 and the interface substrate 130 described above, and related or like components are generally identified by like terms.

The redistribution member 930 can have a body 932 composed of a material that can be flexed at room temperature or at elevated temperatures. The body 932 of the redistribution member 930, for example, can be a thin, flexible material that bends merely under the influence of gravity or a slight force. Suitable materials for the body 932 include tapes or other substrates, such as polyimides and other materials as set forth above with respect to the interface substrate 130. The body 932 can include a first section or die section 934 and a second section or array section 936. The area between the die section 934 and the array section 936 can define an intermediate section 938, but it will appreciated that the intermediate section 938 can merely be a contiguous part of either one of the die section 934 and/or the array section 936.

The die section 934 can include a slot 939 and a plurality of contacts 940 arranged in a terminal array adjacent to the slot 939. The array section 936 can include a plurality of ball-pads 942 arranged in a ball-pad array. The contacts 940 can be coupled to selected ball-pads 942 by interconnecting circuitry 950 that is in or on the body 932. Additionally, certain ball-pads 942 can be coupled to other ball-pads in the ball-pad array by other interconnecting circuitry 950a in the body 932. As explained in more detail below, the die 910 is attached to the die section 934 of the redistribution member 930, and then the array section 936 of the redistribution member 932 is folded (arrow F) to position the array section 936 across from the die section 934 with either the die 910 or a casing between the array section 936 and the die section 934.

Figure 10A:
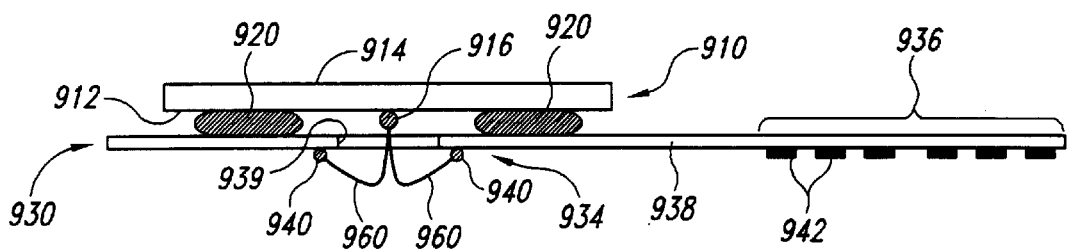
FIGS. 10A–10C are side cross-sectional views illustrating a method of packaging a microelectronic device in accordance with an embodiment of the invention.
Figure 10B:
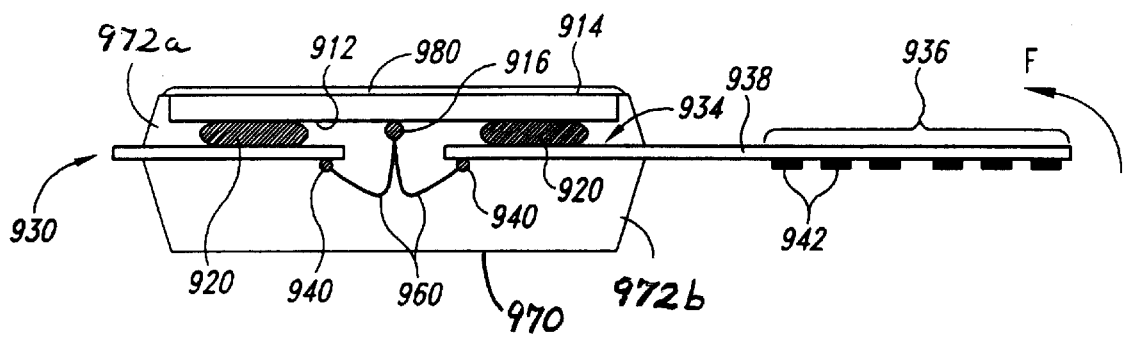
Figure 10C:
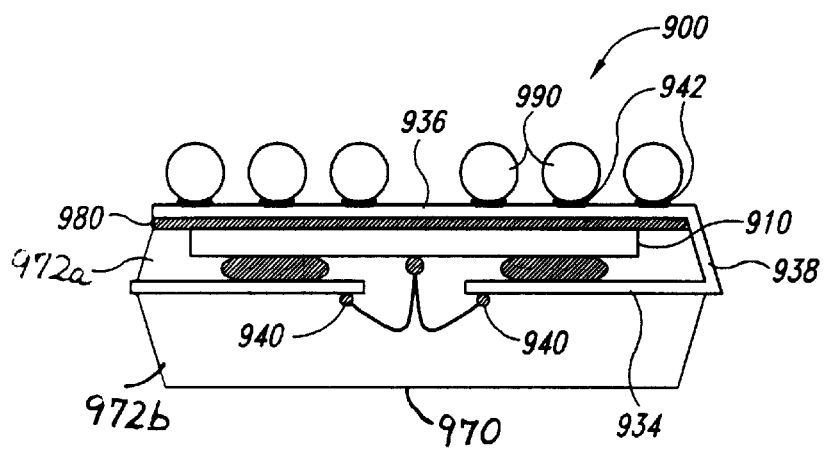

FIGS. 10A–10C illustrate various stages of packaging the microelectronic device 900 in accordance with one embodiment of the invention. Referring to FIG. 10A, the die 910 is attached to the redistribution member 930 with strips of adhesive 920 along the slot 939 on the back side of the die section 934. The bond-pads 916 on the die 910 are then electrically coupled to the contacts 940 on the redistribution member 930 by individual wire bonds 960. The wire-bonds 960 can be gold bonds or other types of materials that are known in the art. In an alternate embodiment, the die section 934 does not include the slot 939, but rather has a plurality of contacts on the side of the body 932 opposite of the ball-pads 942. The bond-pads 916 on the die 910 can be flip-chip mounted to such contacts on the opposite side of the body in a manner similar to the contact between the bond-pads 114 and the contacts 142a described above with reference to FIG. 1.

Referring to FIG. 10B, the active side 914 of the die 910 and the die section 934 of the redistribution member 930 are then encapsulated to form a casing 970. The casing 970 can include a first cover 972a adjacent to the side of the die 910 and a second cover 972b that covers the bond-pads 916, the contacts 940, and the wire-bonds 960. The casing 970 can be molded using a molding compound and techniques known in the art. After molding the casing 970, an adhesive 980 can be applied to the inactive side 914 of the die 910 and the array section 936 of the redistribution member 930 can be folded (arrow F) to position the back side of the second section 936 against the adhesive 980.

FIG. 10C illustrates the packaged microelectronic device 900 after the array section 936 of the redistribution member 930 has been folded on to the adhesive 980 on the inactive side 914 of the die 910. In this configuration, the intermediate section 938 extends around at least a portion of a side surface of the casing 970, and the array section 936 is spaced across from the die section 934. A plurality of conductive/connective balls 990, such as solder balls, can then be deposited onto the ball-pads 942 for coupling the packaged microelectronic device 900 to another device (e.g., a printed circuit board, another packaged microelectronic device for stacking, or other components).

Figure 11:
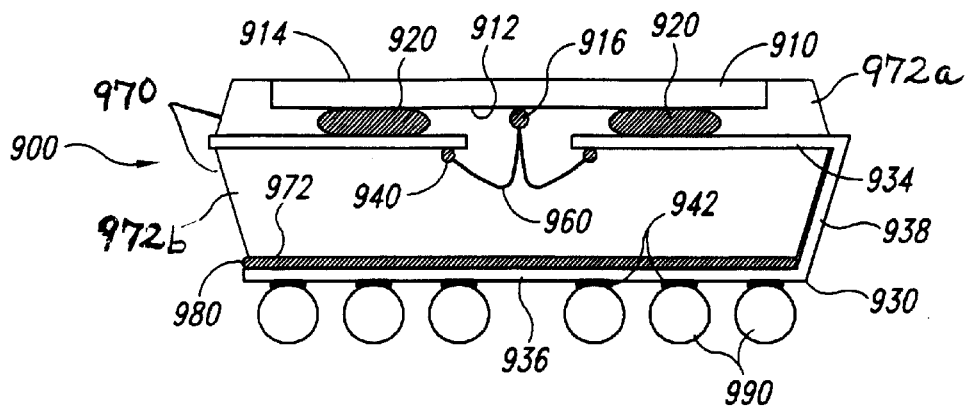
FIG. 11 is a cross-sectional view illustrating a package microelectronic device in accordance with an embodiment of the invention.

FIG. 11 is a cross-sectional view illustrating another embodiment of the microelectronic device 900. In this embodiment the inactive surface 914 at the die 910 remains exposed. The ball-pads 942 on the array section 936 of the redistribution member 930 are accordingly on the opposite side of the redistribution member shown in FIGS. 10A–10C. The array section 936 is folded downward in this embodiment such that the interconnecting section 938 extends around the side of the second cover 972b and is adhered to an exterior face 974 of the casing 970 by an adhesive 980. The embodiment of the packaged device 900 in FIG. 11 is similar to the embodiment shown in FIG. 10C, except that the ball-pads 942 face in the opposite direction. In both embodiments, the array section 936 is spaced across from the die section 934.

Figure 12:
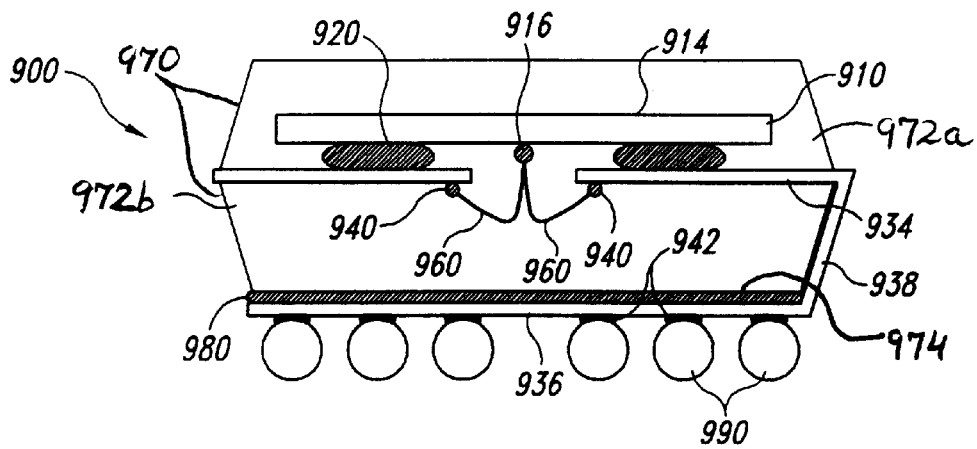
FIG. 12 is a cross-sectional view illustrating a microelectronic device in accordance with another embodiment of the invention.
Figure 13:
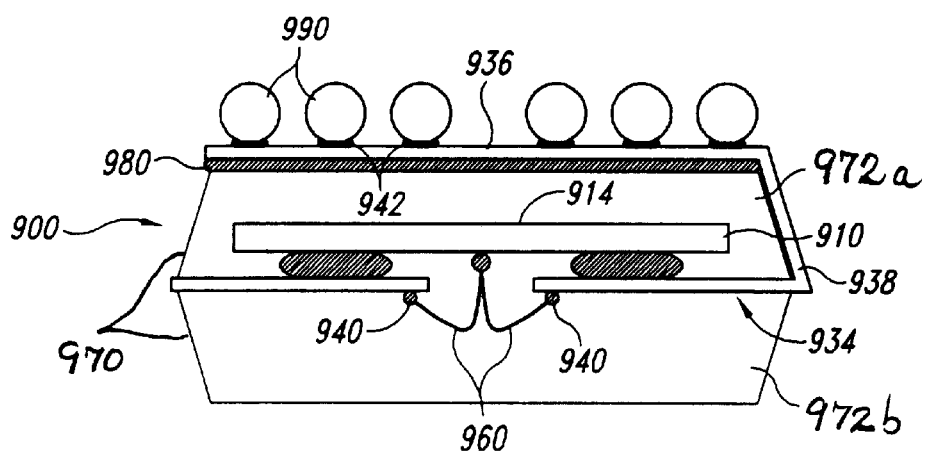
FIG. 13 is a cross-sectional view illustrating a packaged microelectronic device in accordance with yet another embodiment of the invention.

FIGS. 12 and 13 are cross-sectional views illustrating additional embodiments of the microelectronic device 900 in accordance with other aspects of the invention. In these embodiments, the first cover 972a of the casing 970 completely encloses the inactive side 914 of the die 910. In the embodiment shown in FIG. 12, the array section 936 is attached to the second cover 972b by an adhesive 980. Similarly, in the embodiment shown in FIG. 13, the array section 936 is attached to the first cover 972a of the casing. In both of these embodiments, a number of solder balls or other types of connectors 990 can be deposited on to the ball-pads 942.

Figure 14:
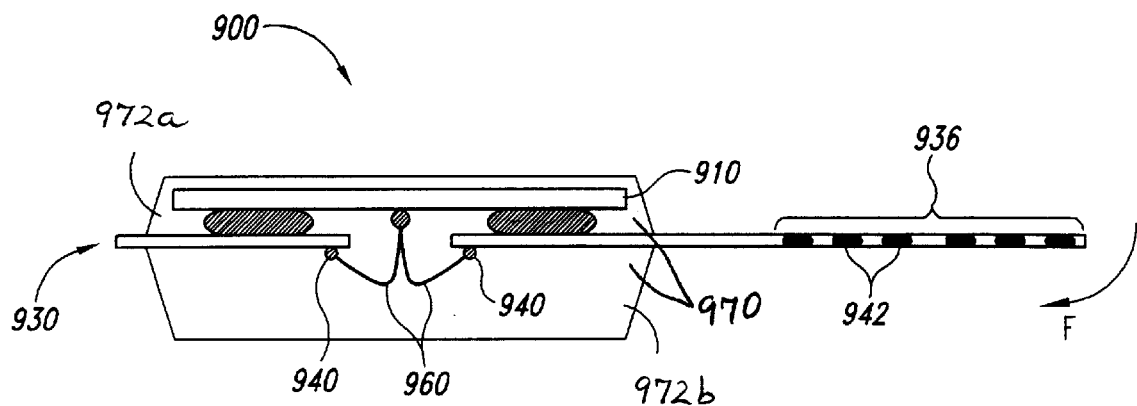
FIG. 14 is a cross-sectional view illustrating an initial stage of a method for manufacturing a packaged microelectronic device in accordance with an embodiment of the invention.
Figure 15A:
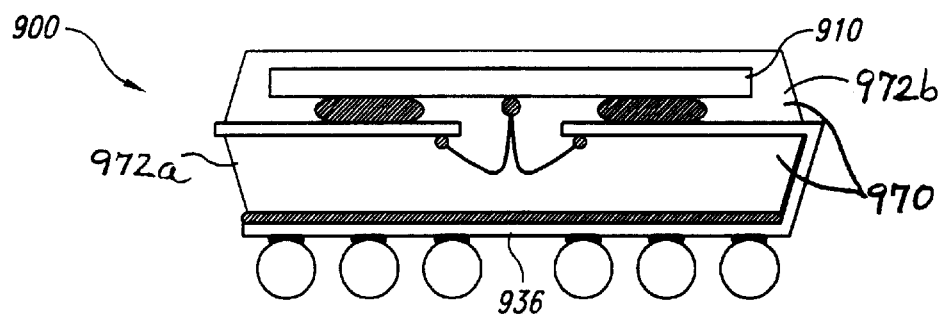
FIGS. 15A and 15B are cross-sectional views illustrating packaged microelectronic devices and methods for manufacturing packaged microelectronic devices in subsequent stages after the initial stage of FIG. 14 in accordance with additional embodiments of the invention.
Figure 15B:
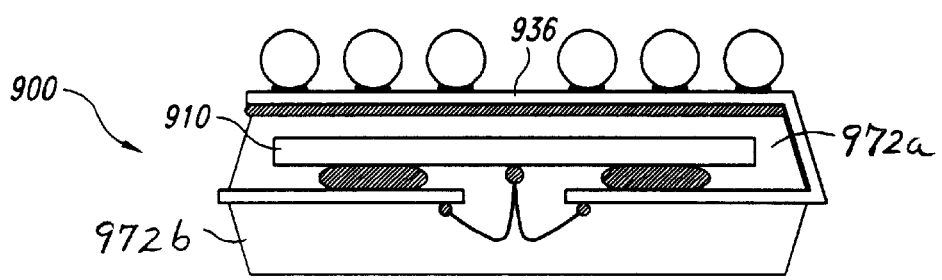

FIGS. 14, 15A and 15B illustrate yet additional embodiments of the microelectronic device 900. Referring to FIG. 14, the microelectronic device 900 is the same as the device shown in FIG. 12, but the ball-pads 942 in FIG. 14 are true via ball-pads that extend completely through the body 932 of the redistribution member 930. Referring to FIGS. 15A and 15B, the array section 936 can be positioned on either the second cover 972b (FIG. 15A) or the first cover 972a in a manner similar to that explained above with reference to FIGS. 12 and 13.

Figure 16:
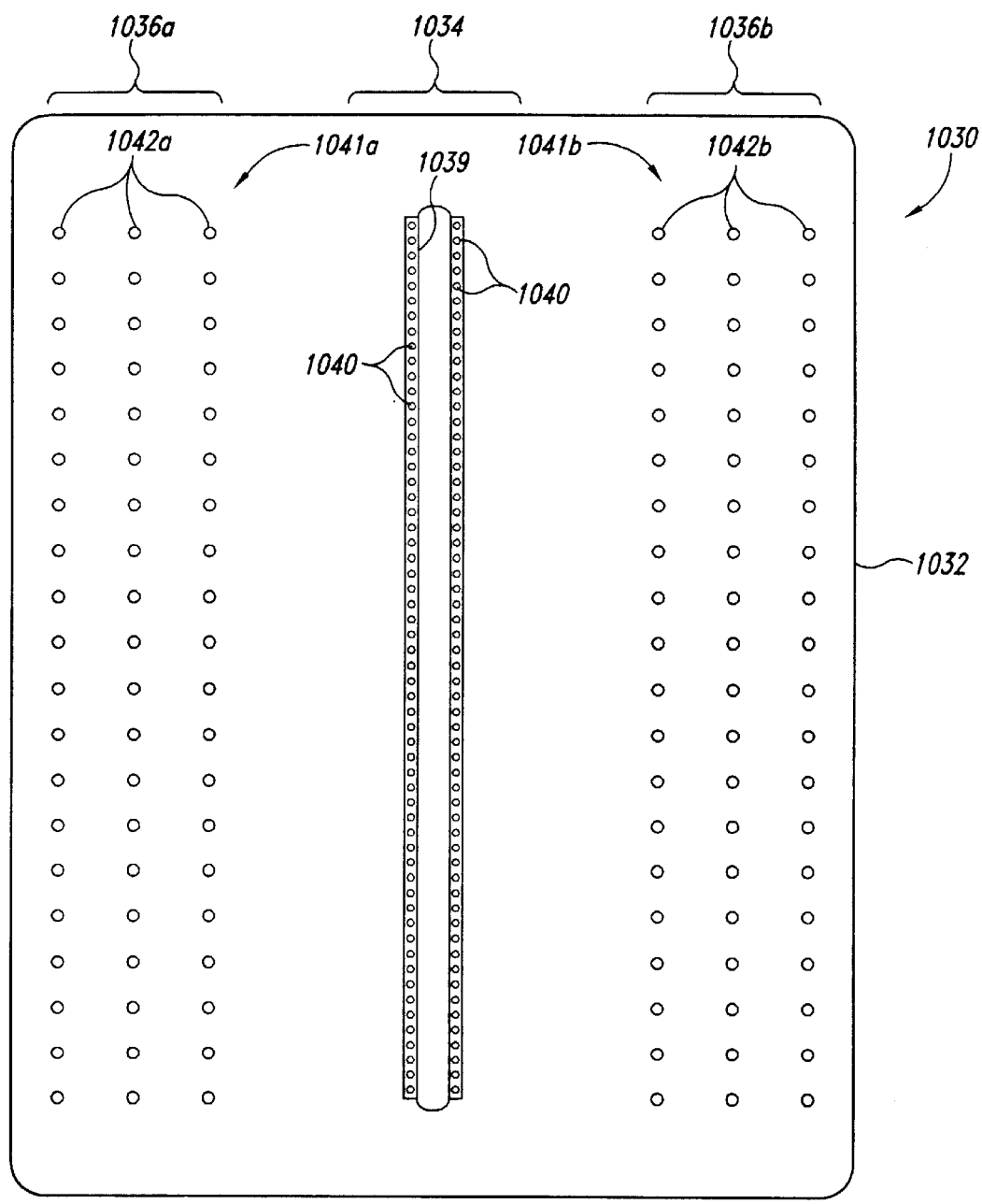
FIG. 16 is a bottom plan view of an interface substrate for packaging a microelectronic device in accordance with an embodiment of the invention.

FIG. 16 is a bottom plan view of a redistribution member 1030 for use in a packaged microelectronic device in accordance with another embodiment of the invention. The redistribution member 1030 can include a body 1032 having a die section 1034, a first array section 1036a, and a second array section 1036b. The redistribution member 1030 also includes a slot 1039 for a board-on-chip configuration similar to the embodiment of the microelectronic device 900 with the slot 939 described above with reference to FIGS. 9–15B. The redistribution member 1030 can also include a first ball-pad array 1041a having a plurality of first ball-pads 1042a, a second ball-pad array 1041b having a plurality of second ball-pads 1042b, and a plurality of contacts 1040 adjacent to the slot 1039. The ball-pads 1042a–b can be coupled to corresponding contacts 1040 and/or other ball-pads 1042a–b by interconnecting circuitry in the body 1032. The materials of the redistribution member 1030 can be similar to those described above with reference to redistribution member 930.

Figure 17A:
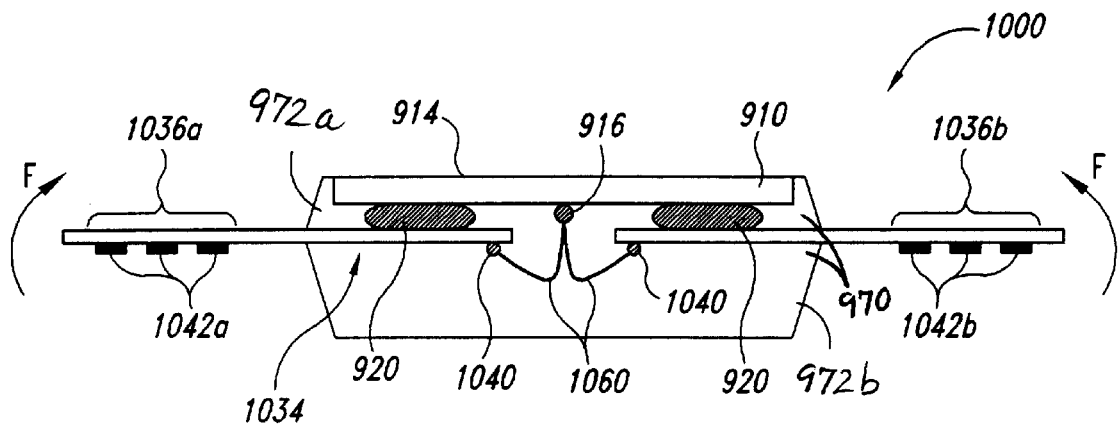
FIGS. 17A and 17B illustrate a method for packaging a microelectronic device and the packaged microelectronic device in accordance with an embodiment of the invention.
Figure 17B:
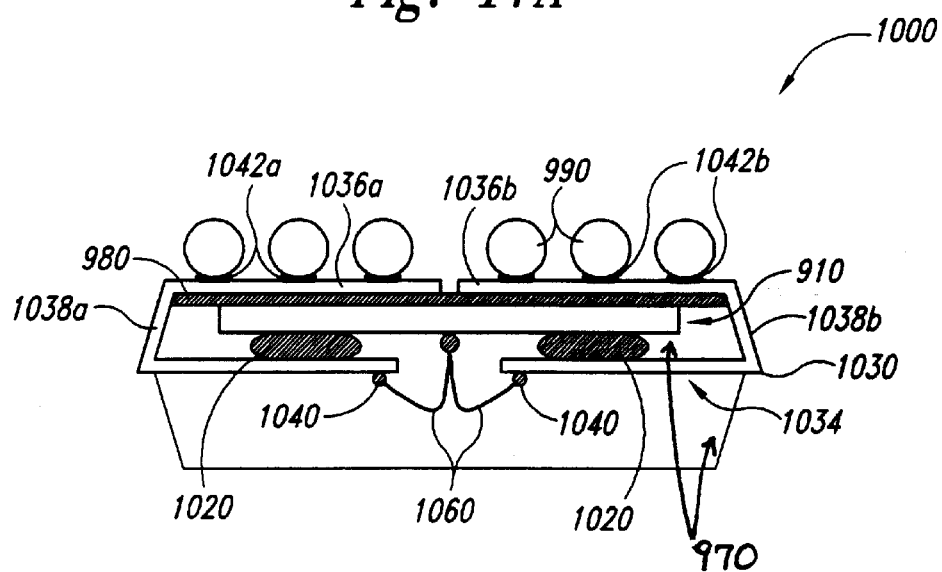

FIGS. 17A and 17B are cross-sectional views of an embodiment of a microelectronic device 1000 using an embodiment of the redistribution member 1030. Referring to FIG. 17A, the die 910 is attached the redistribution member 1030 by strips of an adhesive 920 and the bond-pads 916 are coupled to the contacts 1040 using wire-bonds 1060 that pass through the slot 1039. The bond-pads 916, the wire-bonds 1060, the contacts 1040, and at least a portion of the die 910 are then encapsulated by the casing 970. After molding the casing 970, the first and second array sections 1036a–b are then folded upward (arrow F).

FIG. 17B illustrates the packaged microelectronic die 1000 after the first array section 1036a has been adhered to one side of the die 910 and the second array section 1036b has been adhered to another side of the die 910. The first and second array sections 1036a–b can be adhered to the die 910 by an adhesive 980 as explained above. In this embodiment, the redistribution member 1030 accordingly has a first interconnecting section 1038a extending around one side of the casing 970 and a second interconnecting member 1038b extending around another side of the casing 970.

Figure 18:
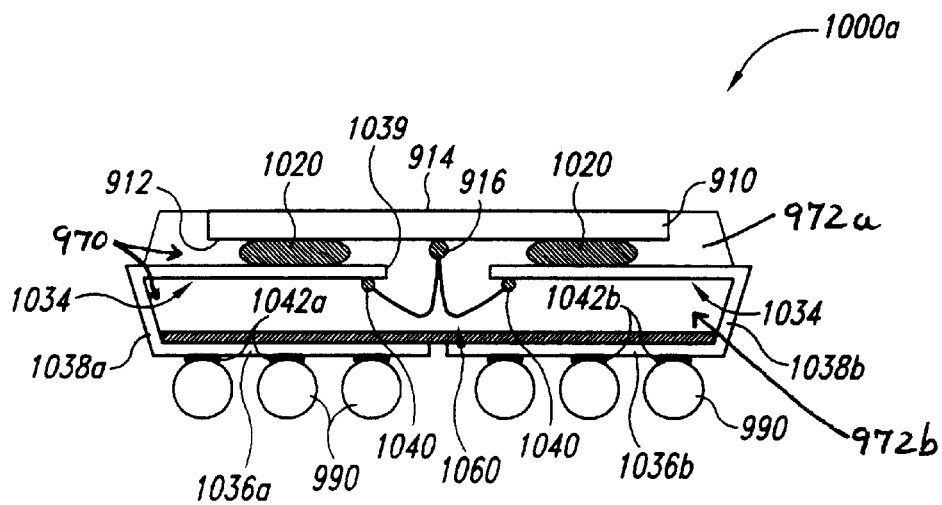
FIG. 18 illustrates a packaged microelectronic device in accordance with an embodiment of the invention.
Figure 19:
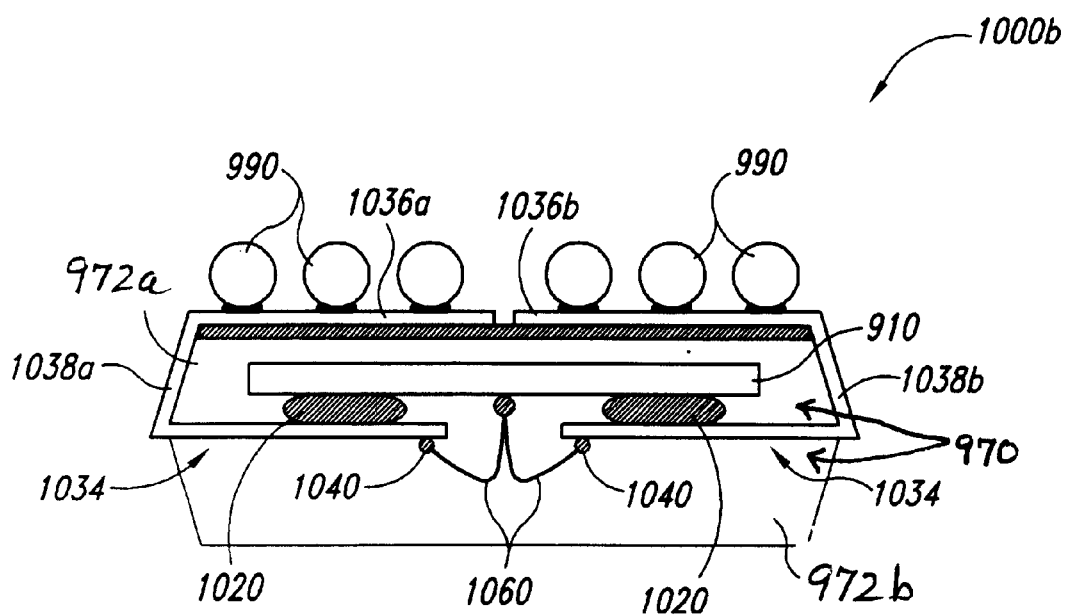
FIG. 19 illustrates a packaged microelectronic device in accordance with another embodiment of the invention.
Figure 20:
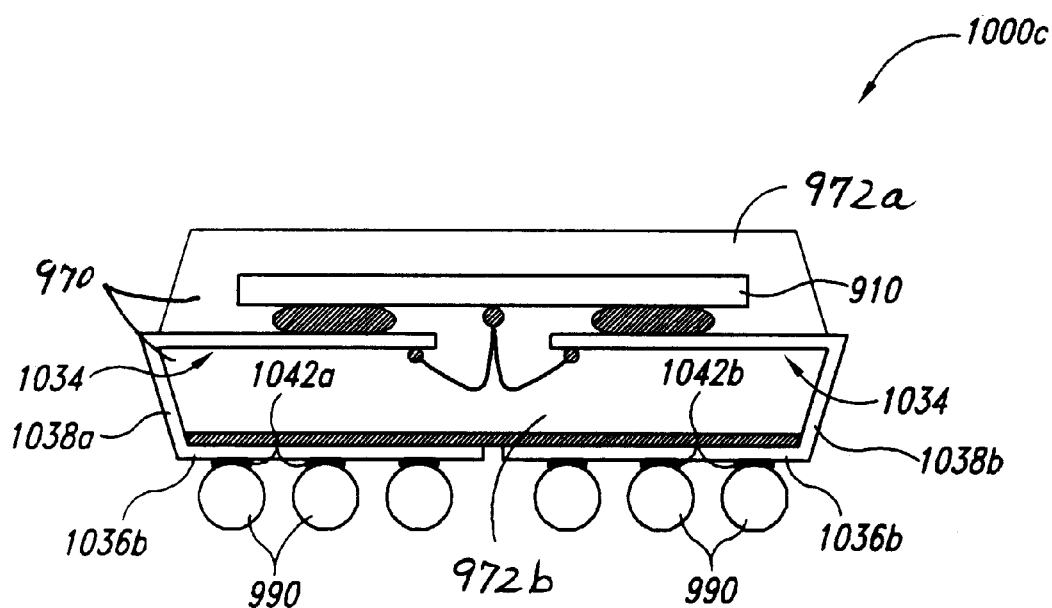
FIG. 20 illustrates a packaged microelectronic device in accordance with yet another embodiment of the invention.

FIGS. 18–20 illustrate additional embodiments of packaged microelectronic devices in accordance with additional embodiments of the invention. The packaged devices 1000a–c shown in FIGS. 18–20, respectively, are similar to the packaged microelectronic device 1000 shown in FIGS. 17A and 17B, and thus like reference members refer to like components throughout these figures. FIG. 18 illustrates a packaged microelectronic device 1000a in which the inactive side 914 of the die 910 is exposed, and the first and second array sections 1036a–b are attached to the second cover 972b of the casing 970. FIG. 19 illustrates a microelectronic device 1000b in which the die 910 is completely encapsulated, and the first and second array sections 1036a–b are attached to the top of the first cover 972a. FIG. 20 illustrates a microelectronic device 1000c that is similar to the microelectronic device 1000b shown in FIG. 19, but the first and second array sections 1036a–b are attached to the second cover 972b.

Figure 21B:
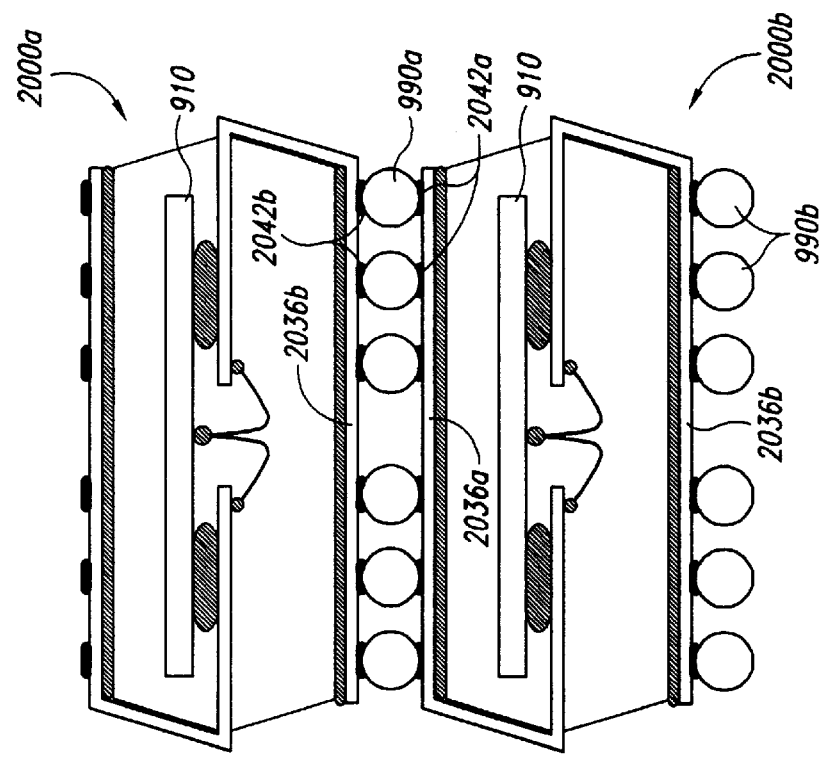
FIGS. 21A and 21B illustrate an embodiment of packaging a microelectronic device and a packaged microelectronic device in accordance with yet another embodiment of the invention.
Figure 21A:
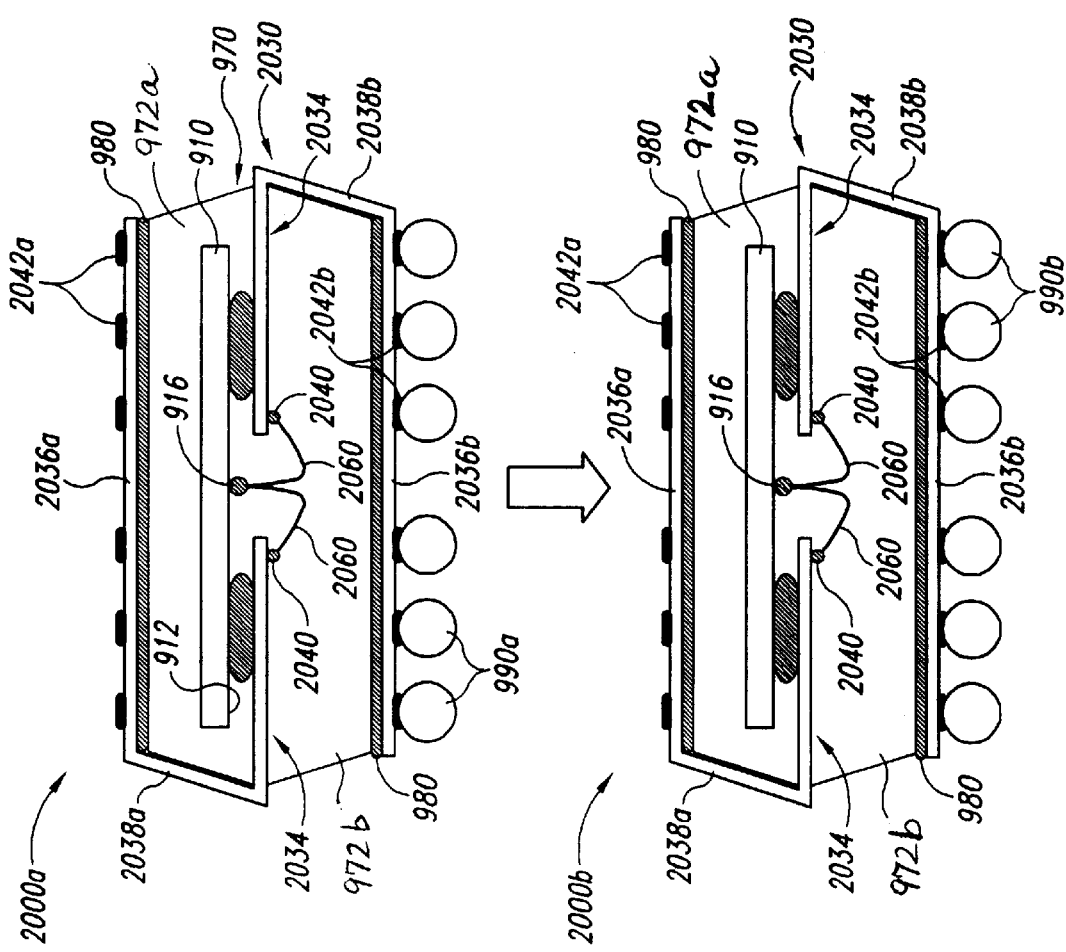

FIGS. 21A and 21B illustrate a stacked die assembly comprising separate packaged microelectronic devices 2000a and 2000b. Referring to FIG. 21A, the first package microelectronic device 2000a can include a die 910, a casing 970 having a first cover 972a and a second cover 972b, and a redistribution member 2030 attached to the active side 912 of the die 910. A portion of the redistribution member 2030 is also sandwiched between the first and second covers 972a–b. The second microelectronic device 2000b can have components that are identical to the first microelectronic device 2000a. In alternate embodiments, the first and second microelectronic devices 2000a–b can be different types of dies, especially if they are not mirror components.

Each of the redistribution members 2030 can include a die section 2034, first and second array sections 2036a and 2036b, and first and second interconnecting sections 2038a and 2038b. The first interconnecting section 2038a can extend from one side of the die section 2034 and around a side portion of the first cover 972a, and the first array section 2036a can extend from the first interconnecting section 2038a and be adhered to an exterior face of the first cover 972a. The second interconnecting section 2038b can extend around a side portion of the second cover 972b, and the second array section 2036b can extend from the second interconnecting section 2038b and be adhered to an exterior face of the second cover 972b.

The die section 2034 can have a plurality of contacts 2040 that can be coupled to the bond-pads 916 on the die 910. The first array section 2036a can include a plurality of first ball-pads 2042a, and the second array section 2036b can include a plurality of second ball-pads 2042b. Each redistribution member 2030 can further include interconnecting circuitry (not shown in FIGS. 21A and 21B). The interconnecting circuitry can (a) couple the contacts 2040 to selected first and/or second ball-pads 2042a–b, and/or (b) couple a number of the first ball-pads 2042a to the second ball-pads 2042b.

FIG. 21B illustrates the first and second microelectronic devices 2000a–b in a stacked configuration. In this embodiment, a plurality of first connectors 990a attached to the second ball-pads 2042b of the first microelectronic device 2000a are mounted to the first ball-pads 2042a of the second microelectronic device 2000b. A plurality of second connectors 900b projecting from the second array section 2036b of the second microelectronic device 2000b can be coupled to yet another packaged microelectronic device for further packaging, a printed circuit board assembly, or another type of component.

Several embodiments of microelectronic devices shown in FIGS. 9–21B are expected to provide several of the same advantages as described above with reference to FIGS. 1–8. For example, many of the embodiments shown and described above need only a single type of testing socket to test different types of devices, and manufacturers need only supply a single type of interposer substrate. This is possible because many embodiments of the invention use a single type of interface substrate or redistribution member that can be used in different applications with different types of dies. Moreover, several embodiments are expected to provide large ball-pad arrays in a small footprint because the redistribution member is flexible and folded over so that the ball-pad array is superimposed relative to the die. As a result, a mold can clamp on the intermediate sections of a redistribution member for encapsulation, and then the redistribution member can be folded so that the ball-grid array is over or under the die. Several embodiments of the microelectronic devices accordingly can have a large ball-pad array with a small footprint for mounting high-performance devices in small spaces.

From the foregoing it will be appreciated that the embodiments of the invention described above provide the best mode of the invention and provide sufficient disclosure to enable a person skilled in the art to make and use these embodiments, but that modifications may be made to these embodiments that add or delete features without deviating from the spirit and scope of the invention. Therefore, the scope of the invention is not limited except as defined only by the claims that follow.

What is claimed is:

1. A microelectronic device, comprising:
   a first microelectronic die including an interior surface, an integrated circuit, and a plurality of first bond-pads arranged in a first terminal array at the interior surface, wherein the bond-pads are coupled to the integrated circuit; and
   a first interface substrate comprising a first section attached to the interior surface of the first die, an intermediate section extending at an angle from the first section, a second section extending from the intermediate section and being spaced across from the first section, a plurality of first contacts arranged in a first contact array on the first section and electrically coupled to the bond-pads of the first die, a plurality of ball-pads on the second section arranged in an exposed ball-pad array, and interconnecting circuitry electrically coupling at least a portion of the ball-pads with corresponding first contacts.

2. The microelectronic device of claim 1 wherein:
   the first die has an active side defined by the interior surface of the first die upon which the first bond-pads are arranged and a backside opposite the active side; and
   the first section of the interface substrate is adhered to the active side of the first die and the second section of the interface substrate is adhered to the backside of the first die.

3. A microelectronic device comprising:
   a first microelectronic die including an interior surface, an integrated circuit, and a plurality of first bond-pads arranged in a first terminal array at the interior surface, wherein the bond-pads are coupled to the integrated circuit, and wherein the first die includes an active side defined by the interior surface of the first die upon which the first bond-pads are arranged and a backside opposite the active side; and
   a first interface substrate comprising a first section adhered to the active side of the first die, an intermediate section extending at an angle from the first section, a second section extending from the intermediate section and being spaced across from the first section, a plurality of first contacts arranged in a first contact array on the first section and electrically coupled to the bond-pads of the first die, a plurality of ball-pads on the second section arranged in an exposed ball-pad array, the second section having a first array section and a second array section that are adhered to the backside of the first die.

4. The microelectronic device of claim 1 further comprising:
   a second die including an interior surface, an integrated circuit, and a plurality of second bond-pads arranged in a second terminal array at the interior surface, wherein the second bond-pads are coupled to the integrated circuit of the second die; and
   a second interface substrate comprising a first section attached to the interior surface of the second die, an intermediate section extending at an angle from the first section, a first array section extending from the intermediate section and being positioned above the second die, a first array of ball-pads on the first array section, a second array section extending from the intermediate section and being positioned below the second die, a second array of ball-pads on the second array section, a plurality of second contacts on the first section that are coupled to the bond-pads of the second die, and interconnecting circuitry electrically coupling the ball-pads in the first array to the second contacts and the ball-pads in the second array, and wherein the ball-pads of the first interface substrate are juxtaposed to the ball-pads of the one of the first or second arrays of the second interface substrate so that the first die and the second die are in a stacked-die arrangement.

* * * * *

UNITED STATES PATENT AND TRADEMARK OFFICE
CERTIFICATE OF CORRECTION

PATENT NO. : 6,560,117 B2
DATED : May 6, 2003
INVENTOR(S) : Ow Chee Moon

It is certified that error appears in the above-identified patent and that said Letters Patent is hereby corrected as shown below:

<u>Column 6,</u>
Line 56, "care" should be -- are --;

<u>Column 9,</u>
Lines 37 and 41, "639a" should be -- 639b --;

Signed and Sealed this

Second Day of March, 2004

JON W. DUDAS
*Acting Director of the United States Patent and Trademark Office*